US009164150B2

(12) United States Patent
Okada

(10) Patent No.: US 9,164,150 B2
(45) Date of Patent: Oct. 20, 2015

(54) DEVICE FOR CALCULATING IMPEDANCES OF BATTERY CELL AND BATTERY IMPEDANCE MEASURING SYSTEM

(75) Inventor: Syuhei Okada, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 630 days.

(21) Appl. No.: 13/561,186

(22) Filed: Jul. 30, 2012

(65) Prior Publication Data

US 2013/0030737 A1    Jan. 31, 2013

(30) Foreign Application Priority Data

Jul. 28, 2011   (JP) .................. 2011-165410

(51) Int. Cl.
*G01R 31/36* (2006.01)
*G06F 19/00* (2011.01)

(52) U.S. Cl.
CPC ........ *G01R 31/3662* (2013.01); *G01R 31/3651* (2013.01)

(58) Field of Classification Search
CPC .................. G01R 31/3651; G01R 31/3662
USPC .............. 702/63, 64, 65, 66, 75, 77; 320/132, 320/134, 136; 324/426, 427, 430, 613; 429/61; 700/297
See application file for complete search history.

(56) References Cited

U.S. PATENT DOCUMENTS

| 2003/0204328 | A1  | 10/2003 | Tinnemeyer |         |
|--------------|-----|---------|------------|---------|
| 2009/0096459 | A1* | 4/2009  | Yoneda et al. | 324/430 |
| 2013/0229156 | A1* | 9/2013  | Brandon et al. | 320/136 |

FOREIGN PATENT DOCUMENTS

| CN | 1791804 A    | 6/2006 |
| CN | 201030802 Y  | 3/2008 |
| CN | 201414016 Y  | 2/2010 |
| CN | 101692109 A  | 4/2010 |
| JP | 2003-4780 A  | 1/2003 |
| JP | 200461372 A  | 2/2004 |
| JP | 2005221487 A | 8/2005 |
| JP | 2005524089 A | 8/2005 |

OTHER PUBLICATIONS

Office Action dated May 6, 2014 issued by the State Intellectual Property Office of P.R. China in counterpart Chinese Application No. 201210266876.1.
Office Action, dated May 23, 2013, issued by the Japanese Patent Office in counterpart Japanese Application No. 2011-165410.

* cited by examiner

Primary Examiner — John H Le
(74) Attorney, Agent, or Firm — Sughrue Mion, PLLC

(57) ABSTRACT

There is provided a device for calculating impedances of a battery cell for respective frequency domains. The device includes: a Fourier transformation calculator configured to perform Fourier transformation on voltage waveform data and current waveform data, which are output from the battery cell, and calculate an impedance of the battery cell by dividing a Fourier transformation data of the voltage waveform data by a Fourier transformation data of the current waveform data; a circuit constant estimator configured to estimate circuit constants of a predetermined equivalent circuit model of the battery cell, based on the impedance calculated by the Fourier transformation calculator; and an impedance estimator configured to estimate impedances of the battery cell for respective frequency domains, based on the estimated circuit constants and the equivalent circuit mode.

11 Claims, 16 Drawing Sheets ject in the impedance measuring system mounted in the vehicle.tic.
DEVICE FOR CALCULATING IMPEDANCES OF BATTERY CELL AND BATTERY IMPEDANCE MEASURING SYSTEM This application claims priority from Japanese Patent Applications No. 2011-165410, filed on Jul. 28, 2011, the entire contents of which are herein incorporated by reference.

BACKGROUND

1. Technical Field

Embodiments described herein relate to a device for calculating impedances of a battery cell for respective frequency domains and a battery impedance measuring system.

2. Related Art

Secondary batteries that are charged repetitively have been widely used as a driving power source for a drive motor of a hybrid vehicle, an electric vehicle, or the like. Furthermore, secondary batteries have been also widely used in industrial fields, public institutions, general households, or the like from the viewpoint that the secondary battery may store energy which is obtained from solar power generation, wind power generation, or the like with a relatively small environmental load, without depending on fossil fuel.

In general, these secondary batteries are configured as a battery module in which a predetermined number of battery cells from which a desired output voltage is obtained are connected in series, or as a battery pack in which a predetermined number of battery modules from which a desired output voltage is obtained are connected in parallel to obtain a desired current capacity (AH).

However, from a convenience aspect of a charging time, traveling distance, and the like, currently, it is believed that the lithium ion battery will become the mainstream for secondary batteries that are mounted in vehicles as a driving power source for a driving motor.

FIG. 10 shows a block diagram illustrating an example of a battery system using the secondary battery in the related art. In FIG. 10, a battery module 10 is configured in such a manner that a plurality of battery cells $11_1$ to $11_n$ and a current sensor 12 are connected in series, and the battery module 10 is connected to a load L in series.

A battery monitoring device 20 includes a plurality of A/D converters $21_1$ to $21_{n+1}$ that are provided to independently correspond to the plurality of battery cells $11_1$ to $11_n$ and the current sensor 12 that make up the battery module 10, and a processing device 23 to which output data of the A/D converters $21_1$ to $21_{n+1}$ is input via an internal bus 22.

An output voltage of each of the battery cells $11_1$ to $11_n$ of the battery module 10 and a detection signal of the current sensor 12 of the battery module 10 are input to the corresponding A/D converters $21_1$ to $21_{n+1}$ and are converted to digital signals, and the output data of the A/D converters $21_1$ to $21_{n+1}$ is input to the processing device 23 via the internal bus 22.

The processing device 23 obtains, for example, an internal resistance value of each of the battery cells $11_1$ to 11 based on the output data of the A/D converters $21_1$ to $21_{n+1}$, estimates a value corresponding to voltage drop at the time of taking out a desired current from the internal resistance value, and transmits this data to a host battery system controller 40 via an external bus 30.

The battery system controller 40 controls the battery module 10 and the load device L in order to stably drive the load device L by a current output voltage of the battery module 10 based on the data input from the battery monitoring device 20.

As an index of evaluating performance of the secondary battery making up the battery module 10, an internal impedance characteristic shown in FIGS. 11 and 12 may be exemplified. FIG. 11 shows a diagram illustrating an impedance characteristic example in a case where a fully charged battery is left as is in a high-temperature state, and FIG. 12 shows a diagram illustrating an impedance characteristic example in the case of repeated charge and discharge in a high-temperature state. In addition, in FIGS. 11 and 12, the left-side drawing illustrates a Cole-Cole plot in which complex impedance based on an AC impedance measurement result is plotted in complex coordinates, and the right-side drawing illustrates a Bode diagram showing an impedance frequency characteristic.

The left-side drawing of FIG. 11 shows a process in which the period left increases, for example, for one year, for two years, . . . , AC impedance increases. The left-side drawing of FIG. 12 shows a process in which as the charge and discharge is repeated, for example, for 50 times, for 100 times, . . . , the AC impedance increases.

As the impedance increases, voltage drop of a battery increases when producing a current, and thus a sufficient output voltage may not be obtained. A low-frequency portion of the right-side drawing corresponds to a case in which an accelerator of a vehicle is continuously pressed for a long time. From this data, since the impedance increases at the low-frequency portion, it may be assumed that the voltage drop gradually increases. That is, an output characteristic varies according to deterioration of the battery, and thus a sufficient output may not be produced.

FIG. 13 shows a block diagram illustrating an example of a measuring circuit that measures the AC impedance of the secondary battery in the related art, and in FIG. 13, the same reference numerals are attached to the same parts as FIG. 10. In FIG. 13, a sweep signal generator 50 is connected to both ends of a serial circuit of the battery 10 and the current sensor 12. This sweep signal generator 50 outputs an AC signal in which an output frequency varies in a sweeping manner within a range including a frequency characteristic region shown in the right-side drawing of FIGS. 11 and 12 to the serial circuit of the battery 10 and the current sensor 12.

An AC voltage monitor 60 measures AC voltage of both ends of the battery 10, and inputs this AC voltage to an impedance calculator 80. An AC current monitor 70 measures an AC current that flows to the current sensor 12 and inputs this AC current to the impedance calculator 80.

The impedance calculator 80 calculates complex impedance of the battery 10, which is a ratio between a measured voltage of the AC voltage monitor 60 at each frequency of the output signal of the sweep signal generator 50 and a measured current of the AC current monitor 70. The calculated complex impedance is plotted on the complex plane, thereby obtaining the Cole-Cole plot shown in FIGS. 11 and 12.

From the Cole-Cole plot that is created in this way, for example, each parameter of an equivalent circuit of the battery 10 as shown in FIG. 14 may be estimated. In addition, in the equivalent circuit of FIG. 14, a DC power source E, a resistor R1, a parallel circuit of a resistor R2 and a capacitor C2, a parallel circuit of a resistor R3 and a capacitor C3, and a parallel circuit of a resistor R4 and an inductance L4 are connected in series. JP-A-2003-4780 discloses in detail measurement of impedance by an alternating current method together with an automatic measurement method.

As described above, since various kinds of information of a battery may be obtained through measurement of the internal impedance characteristic of the battery, when the internal impedance characteristic of the battery may be measured on the spot, such as a vehicle, a power plant, a household power storage system, and the like that actually use the battery, a present state of the battery may be ascertained based on the information, and the battery may be controlled so as to be effectively used to the maximum depending on the present state of the battery.

However, in the system configuration in the related art shown in FIG. 10, the internal resistance value of each of the battery cells $11_1$ to $11_n$ may be obtained, but since data communication between the processing device 23 and the battery system controller 40 is performed intermittently, voltage data of each of the battery cells $11_1$ to $11_n$ becomes discrete data of which a period is, for example, 100 ms or more.

As a result thereof, only a state of each of the battery cells $11_1$ to $11_n$ may be detected with reference to a table including a voltage, a current, a temperature, and the like, and the internal impedance characteristic of each of the battery cells $11_1$ to $11_n$ in which many pieces of information are collectively contained may not be measured.

In addition, according to the measuring circuit in the related art as shown in FIG. 13, the sweep signal generator 50 is necessary, and it is difficult to mount the measuring circuit as shown in FIG. 13 in each of the on-site cells in terms of both cost and space.

SUMMARY OF THE INVENTION

It is an illustrative aspect of the invention to provide a battery impedance measuring device that may measure a battery internal impedance characteristic of the battery that is used for a battery monitoring device in real time on the spot such as, for example, a vehicle, a power plant, a household power storage system, and the like that actually use the battery.

According to one or more illustrative aspects of the present invention, there is provided a device (24, 24c) for calculating impedances of a battery cell (11) for respective frequency domains. The device includes: a Fourier transformation calculator (c2) configured to perform Fourier transformation on voltage waveform data and current waveform data, which are output from the battery cell, and calculate an impedance of the battery cell by dividing a Fourier transformation data of the voltage waveform data by a Fourier transformation data of the current waveform data; a circuit constant estimator (c4) configured to estimate circuit constants of a predetermined equivalent circuit model of the battery cell, based on the impedance calculated by the Fourier transformation calculator; and an impedance estimator (c7) configured to estimate impedances of the battery cell for respective frequency domains, based on the estimated circuit constants and the equivalent circuit mode.

According to one or more illustrative aspects of the present invention, there is provided a device (24, 24c) for calculating impedances of a battery cell (11) for respective frequency domains. The device includes: a Fourier transformation calculator (c2) configured to perform Fourier transformation on voltage waveform data and current waveform data, which are output from the battery cell, and calculate an impedance of the battery cell by dividing a Fourier transformation data of the voltage waveform data by a Fourier transformation data of the current waveform data; a circuit model selector (c9) configured to select a certain equivalent circuit model from among a plurality of equivalent circuit model, based on the impedance calculated by the Fourier transformation calculator; and a circuit constant estimator (c4) configured to estimate circuit constant of the selected equivalent circuit model, based on the impedance calculated by the Fourier transformation calculator.

According to one or more illustrative aspects of the present invention, the device further includes: a non-variable circuit constant storage unit (c5) configured to store a non-variable circuit constant (R4, L4) of the estimated circuit constants therein; and a variable circuit constant storage unit (c6) configured to store a variable circuit constant (R1,R2,C2 . . . ) of the estimated circuit constants therein. The impedance estimator is configured to estimate the impedances of the battery cell based on the non-variable circuit constant, the variable circuit constant and the equivalent circuit mode.

According to one or more illustrative aspects of the present invention, the circuit model selector is configured to select the certain equivalent circuit model based on the following steps: 1) whether or not a Warburg element is present; 2) whether or not an LR parallel circuit is present; and 3) the number of stages of an RC parallel circuit.

According to one or more illustrative aspects of the present invention, the Fourier transformation calculator is a discrete Fourier transformation calculator configured to discreet Fourier transformation on the voltage waveform data and the current waveform data, and calculate an impedance of the battery cell by dividing a discrete Fourier transformation data of the voltage waveform data by a discrete Fourier transformation data of the current waveform data.

According to one or more illustrative aspects of the present invention, the Fourier transformation calculator is a fast Fourier transformation calculator configured to fast Fourier transformation on the voltage waveform data and the current waveform data, and calculate an impedance of the battery cell by dividing a fast Fourier transformation data of the voltage waveform data by a fast Fourier transformation data of the current waveform data.

According to one or more illustrative aspects of the present invention, there is provided a battery impedance measuring system. The system includes: a battery module (10) comprising a plurality of battery cells ($11_1$ . . . $11_n$) and configured to provide power to a load (L); a plurality of devices ($24_1$ . . . $24_n$) each provided for a corresponding one of the battery cells to calculate impedances of the corresponding battery cell for respective frequency domains. Each of the devices includes: a Fourier transformation calculator (c2) configured to perform Fourier transformation on voltage waveform data and current waveform data, which are output from the corresponding battery cell, and calculate an impedance of the corresponding battery cell by dividing a Fourier transformation data of the voltage waveform data by a Fourier transformation data of the current waveform data; a circuit constant estimator (c4) configured to estimate circuit constants of a predetermined equivalent circuit model of the corresponding battery cell, based on the impedance calculated by the Fourier transformation calculator; and an impedance estimator (c7) configured to estimate impedances of the corresponding battery cell for respective frequency domains, based on the estimated circuit constants and the equivalent circuit mode.

According to one or more illustrative aspects of the present invention, there is provided a battery impedance measuring system. The system includes: a battery module (10) comprising a plurality of battery cells ($11_1$ . . . $11_n$) and configured to provide power to a load (L); a plurality of devices ($24_1$ . . . $24_n$) each provided for a corresponding one of the battery cells to calculate impedances of the corresponding battery cell for respective frequency domains. Each of the devices includes: a Fourier transformation calculator (c2) configured to perform Fourier transformation on voltage waveform data and current waveform data, which are output from the corresponding battery cell, and calculate an impedance of the corresponding battery cell by dividing a Fourier transformation data of the voltage waveform data by a Fourier transformation data of the current waveform data; a circuit model selector (c9) configured to select a certain equivalent circuit model from among a plurality of equivalent circuit model, based on the impedance calculated by the Fourier transformation calculator; and a circuit constant estimator (c4) configured to estimate circuit constant of the selected equivalent circuit model, based on the impedance calculated by the Fourier transformation calculator.

Other aspects and advantages of the present invention will be apparent from the following description, the drawings and the claims.

DETAILED DESCRIPTION

Figure 1:
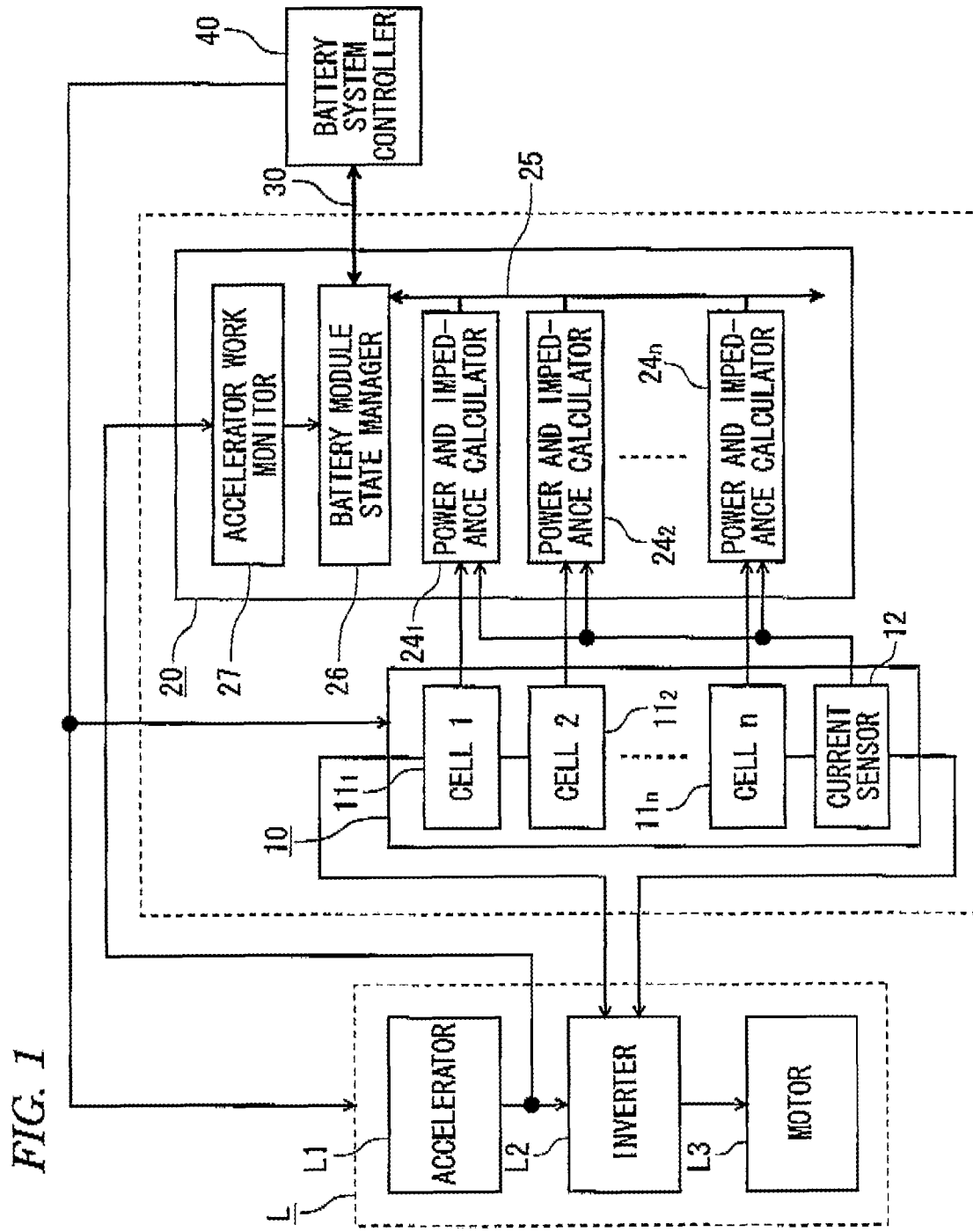
FIG. 1 shows a block diagram illustrating a specific example of a battery monitoring device in which a battery impedance measuring device according to the invention is used.
Figure 10:
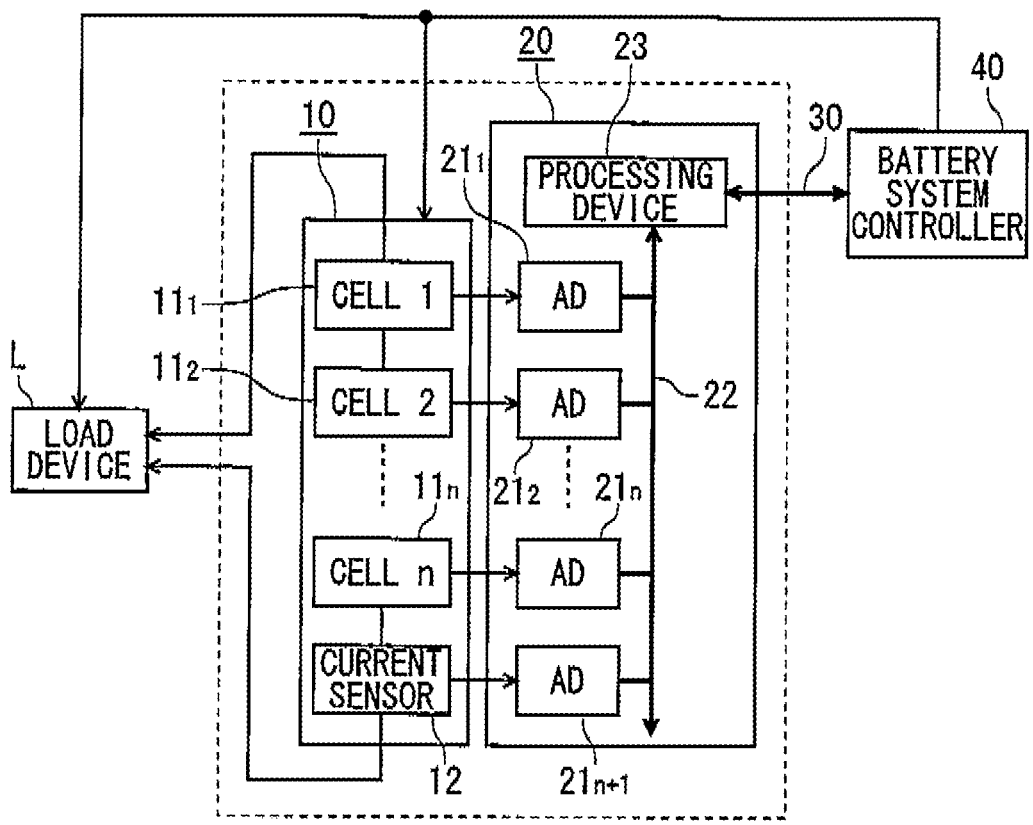
FIG. 10 shows a block diagram illustrating an example of a battery system using a secondary battery in the related art.
Figure 11:
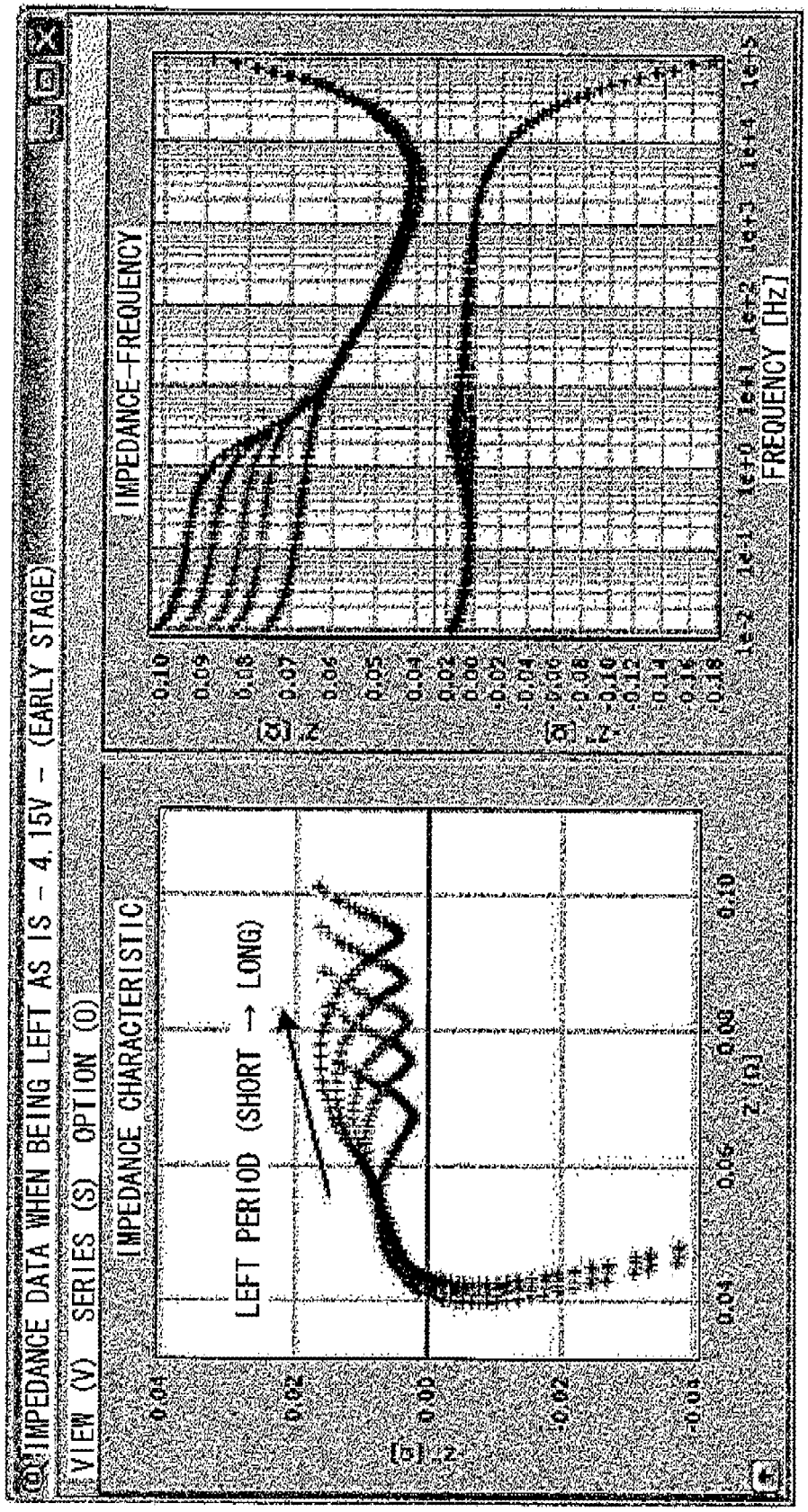
FIG. 11 shows a diagram illustrating an impedance characteristic example in a case where a fully charged battery is left in a high-temperature state.
Figure 12:
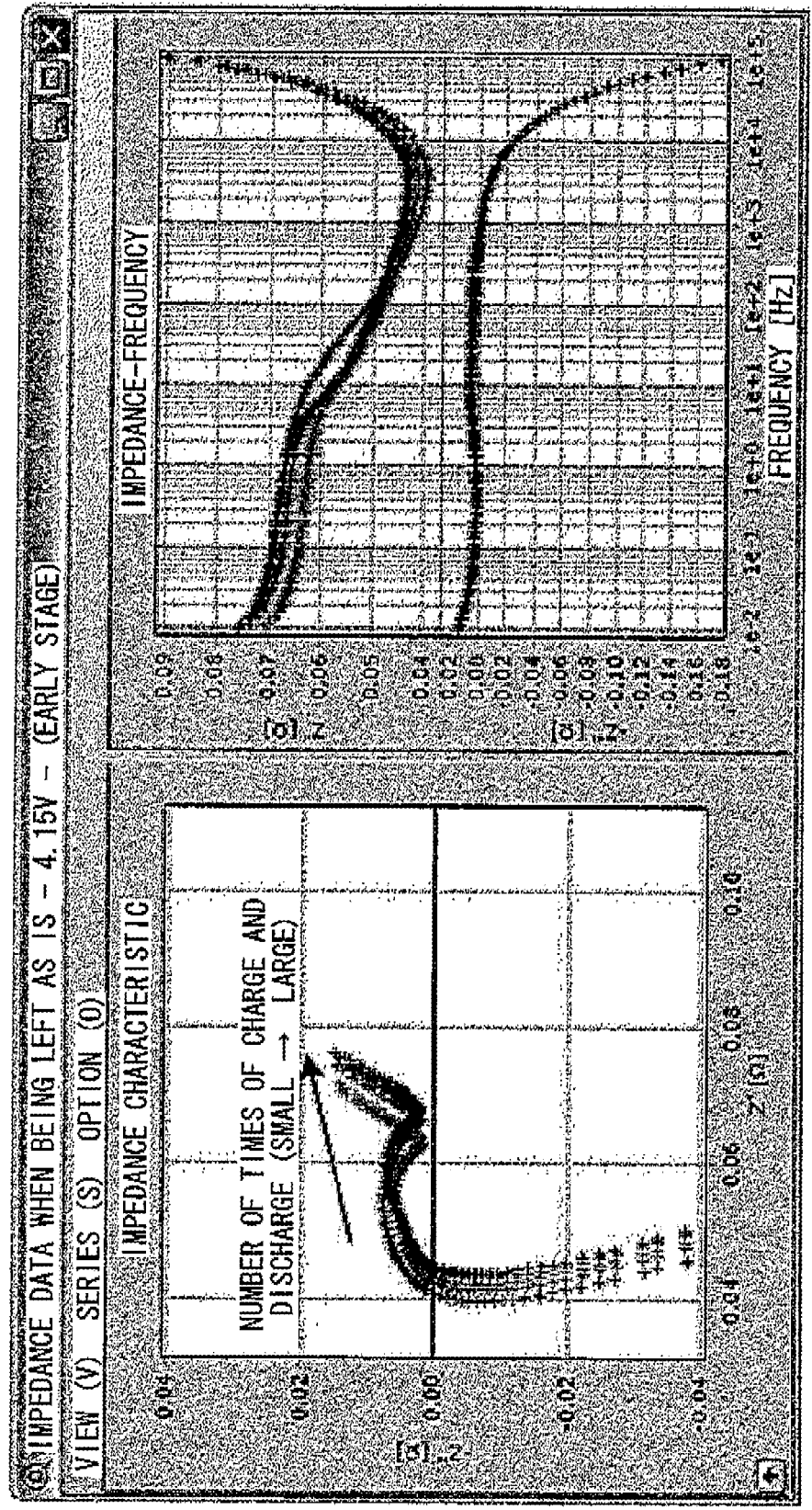
FIG. 12 shows a diagram illustrating an impedance characteristic example in the case of repeated charge and discharge in a high-temperature state.
Figure 13:
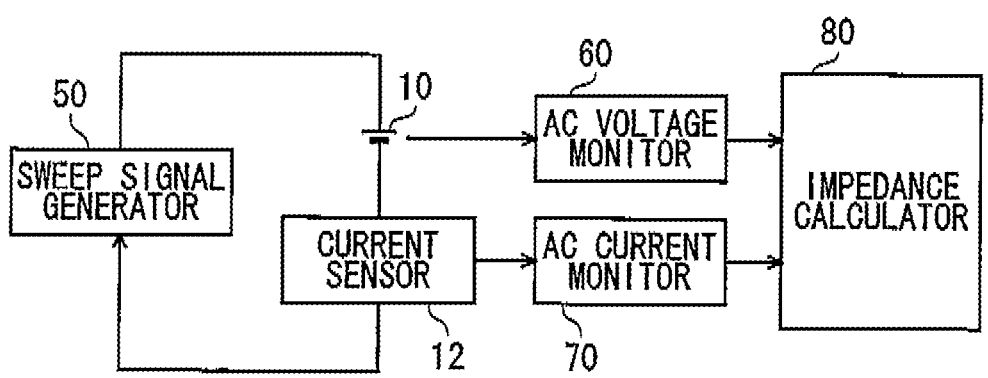
FIG. 13 shows a block diagram illustrating an example of a measuring circuit that measures the AC impedance of the secondary battery in the related art.

Hereinafter, embodiments of the invention will be described in detail with reference to the attached drawing. FIG. 1 is a block diagram illustrating a specific example of a battery monitoring device in which a battery impedance measuring device according to the invention is used, and the same reference numerals are attached to the same portions as FIG. 10. In FIG. 1, a battery monitoring device 20 includes a plurality of n power and impedance calculators $24_1$ to $24_n$ that are provided in correspondence with a plurality of n battery cells $11_1$ to $11_n$ that make up a battery module 10, a battery module state manager 26 to which output data of the power and impedance calculators $24_1$ to $24_n$ is input via an internal bus 25, and an accelerator work monitor 27 that monitors movement of an accelerator L1 makes up a driving system of a vehicle as a load device L.

In the driving system of a vehicle as the load device L, the accelerator L1, an inverter L2, and a motor L3 are substantially connected in series. The inverter L2 and the battery module 10 are connected in series, and driving power necessary for rotary driving of the motor L3 is supplied from the battery module 10. A speed of the motor L3 is controlled to rotate at a driver's intended rotational speed by controlling an amount of driving power that is supplied to the inverter L2 in response to movement of the accelerator L1 that is manipulated by the driver, for example, by using a pedal.

The movement of the accelerator L1 in response to the pedal manipulation by the driver is continuously monitored and detected by the accelerator work monitor 27, and a detection signal thereof is input to the power and impedance calculators $24_1$ to $24_n$ via the battery module state manager 26 and the internal bus 25.

A voltage signal from each of the corresponding battery cells $11_1$ to $11_n$ and a current signal from the current sensor 12 are input to the power and impedance calculators $24_1$ to $24_n$.

Here, the movement of the accelerator L1 in response to the pedal manipulation by the driver causes a variation such as rising and falling like a staircase wave including broadband frequency components with respect to an output voltage waveform of each of the battery cells $11_1$ to $11_n$ and an output current waveform of the current sensor 12.

The power and impedance calculators $24_1$ to $24_n$ perform discrete Fourier transformation (DFT) or fast Fourier transformation (FFT) with respect to waveform data including the broadband frequency components, and estimate an equivalent circuit constant in a desired frequency domain from this result. The internal impedance characteristic of the battery may be measured in the on-site such as a vehicle and a plant that actually use the battery, and the battery state may be monitored in real time.

The battery module state manager 26 fetches instantaneous power information and internal impedance information, which are measured by each of the power and impedance calculators $24_1$ to $24_n$ of the respective battery cells $11_1$ to $11_n$ that make up the battery module 10, and transmits the data to a host battery system controller 40 via the external bus 30.

The battery system controller 40 controls the battery module 10 and the load device L based on data that is input from the battery monitoring device 20 so as to stably operate the load device L with, a current output voltage of the battery module 10, ascertains a transitional situation in the performance of each of the battery cells $11_1$ to $11_n$ based on a variation trend of an amount of instantaneous power of each of the battery cells $11_1$ to $11_n$, a variation trend of the internal impedance information, or the like, dispatches an alarm that urges the charging to be performed, or outputs replacement time prediction data about the battery module 10, or the like by analyzing performance deterioration trend.

Figure 2:
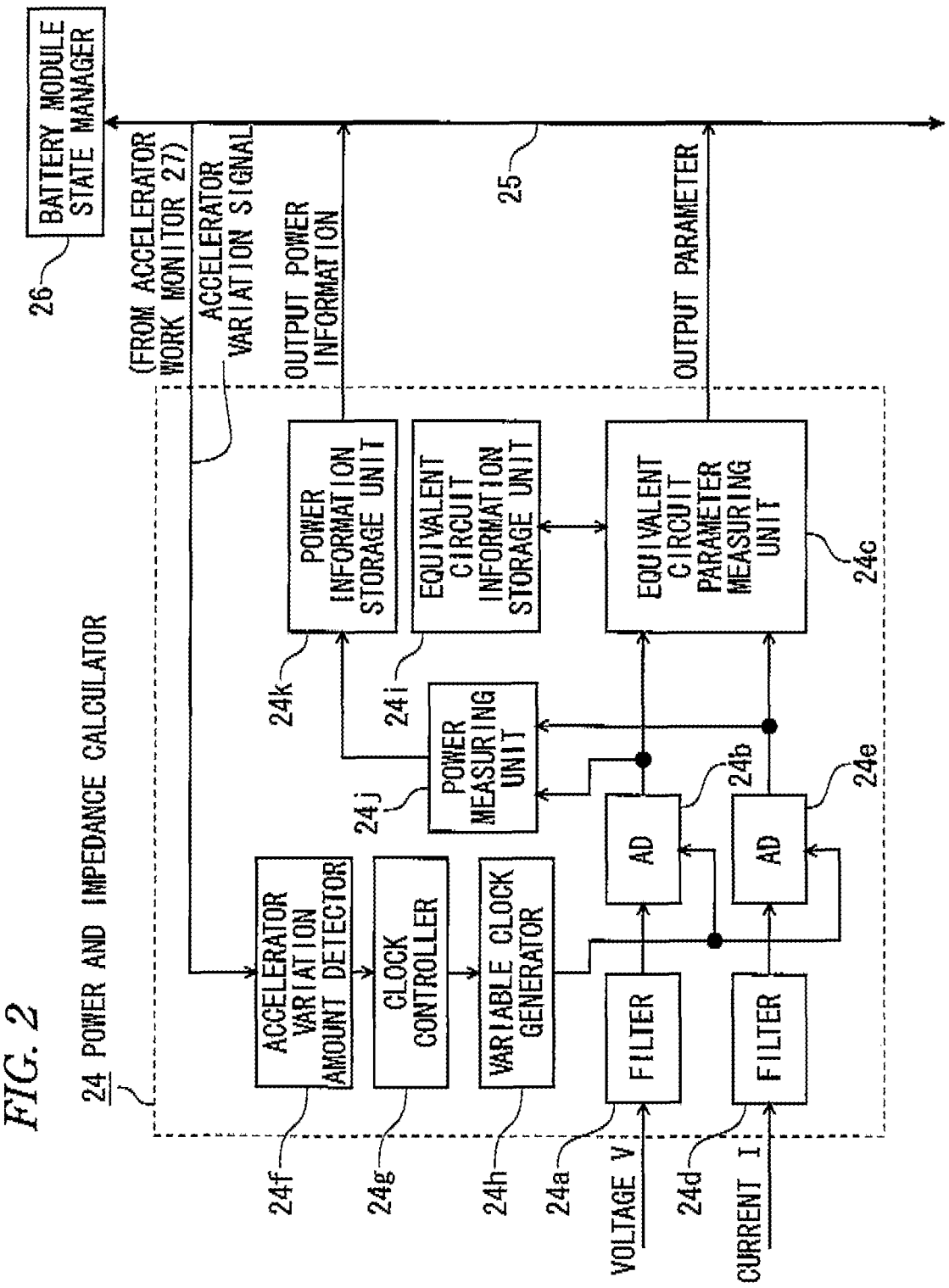
FIG. 2 shows a block diagram illustrating a specific example of a power and impedance calculator 24.

FIG. 2 shows a block diagram illustrating a specific example of the power and impedance calculator 24. In FIG. 2, a voltage signal V of each of the battery cells $11_1$ to $11_n$ is input to an A/D converter 24b via an anti-aliasing filter 24a, and output data of the A/D converter 24b is input to an equivalent circuit parameter measuring unit 24c.

A current signal I from the current sensor 12 is input to an A/D converter 24e via an anti-aliasing filter 24d, and output data of the A/D converter 24e is input to the equivalent circuit parameter measuring unit 24c.

The A/D converters 24b and 24e are operated by a variable clock system that is made up by the battery module state manager 26, an accelerator variation amount detector 24f, a clock controller 24g, and a variable clock generator 24h, and that is created based on an accelerator variation signal that is detected by the accelerator work monitor 27 and is output therefrom. Due to this, there is generated a clock based on driver's accelerator work such as start-up, acceleration, high-speed travel, low-speed travel, deceleration, stop, retraction, and a speed thereof, and the voltage signal V and the current signal I in each state are converted to digital data.

In addition, a sampling clock frequency of the A/D converters 24b and 24e may be changed in response to a frequency band at which the internal impedance of each of the battery cells $11_1$ to $11_n$ is desired to be measured. For example, in the case of measuring the internal impedance up to 1 kHz, the sampling clock frequency is set to 2K sample's, and a low-pass band of the anti-aliasing filters 24a and 24d is set to 1 kHz or less.

An equivalent circuit information storage unit 24i, which stores equivalent circuit information such as an equivalent circuit pattern of each of the battery cells $11_1$ to $11_n$ that are desired to be measured, is connected to the equivalent circuit parameter measuring unit 24c. Each parameter of the equivalent circuit, which is measured in the equivalent circuit parameter measuring unit 24c, is fetched to the battery module state manager 26 via the internal bus 25.

Output data of the A/D converters 24b and 24e is also input to a power measuring unit 24j. Due to this, the power measuring unit 24j measures instantaneous power of each of the battery cells $11_1$ to $11_n$, and stores the measured result in a power information storage unit 24k. The power information stored in the power information storage unit 24k is fetched to battery module state manager 26 via the internal bus 25.

In recent years, research on ascertaining a battery state has been actively performed. In this research, an impedance characteristic is obtained by applying a sign wave with a constant voltage or a constant current with respect to the battery, and a temperature characteristic of charge and discharge, a remaining amount of charge, a degree of performance deterioration, or the like is estimated.

In a single body state before a battery is mounted in a system such as a vehicle, impedance measurement may be performed in a prepared measurement environment, but when the battery is mounted in a system, the impedance measurement may not be performed sufficiently due to restriction on the system or the like. Particularly, when the battery is mounted as a driving power source of the vehicle, a sample rate on the system side is insufficient, and thus it is assumed that a high frequency domain may not be sampled. In this case, comparison in correspondence with a measurement range that is measured in advance may be impossible.

Figure 3:
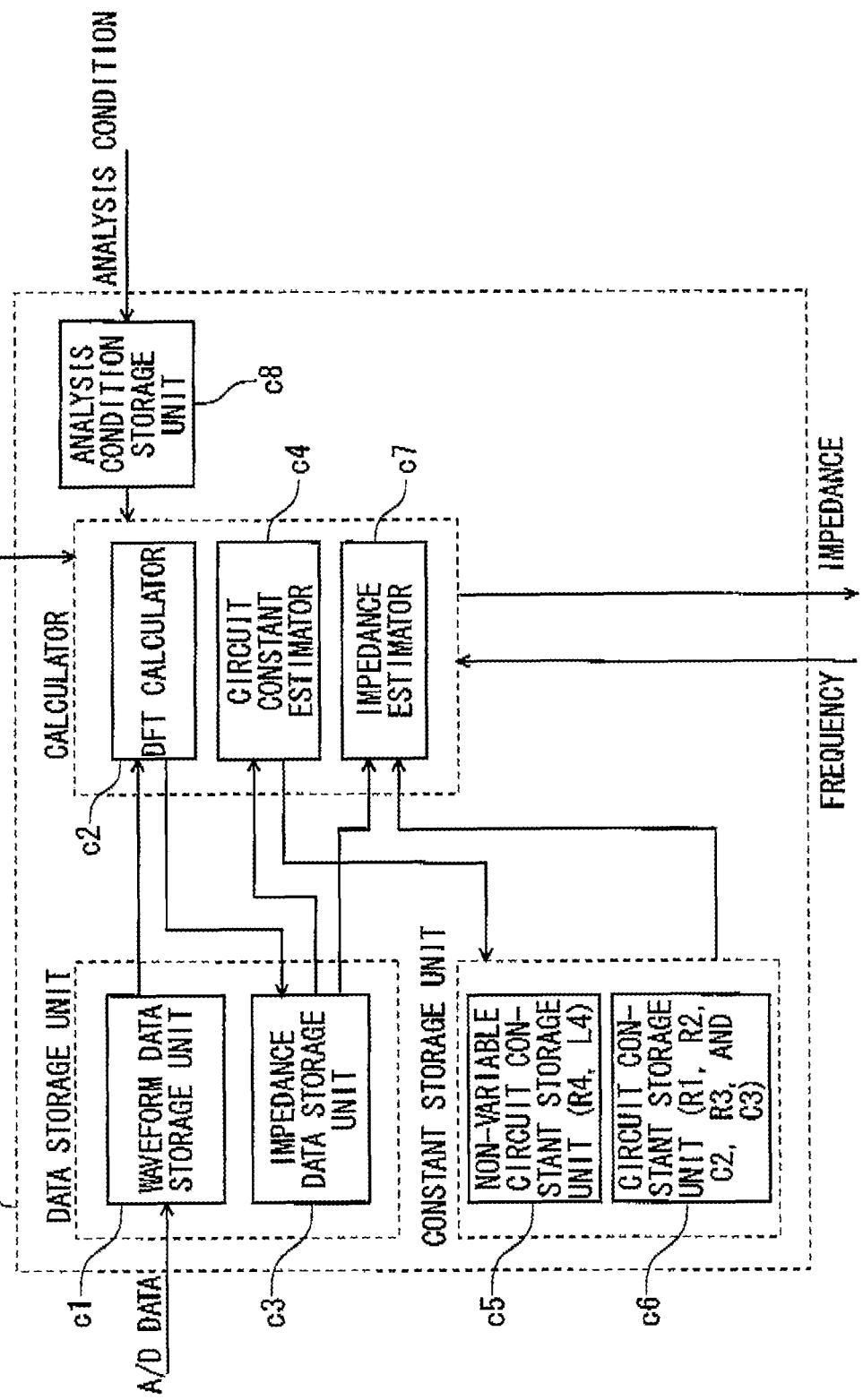
FIG. 3 shows a block diagram illustrating an embodiment of the invention.

FIG. 3 shows a block diagram illustrating an embodiment of the invention, which has an impedance estimation function in an arbitrary frequency, and shows a specific example of the equivalent circuit parameter measuring unit 24c making up the power and impedance calculator 24 of FIG. 2. Output data of the A/D converters 24b and 24e is sequentially stored in a waveform data storage unit c1.

A DFT calculator c2 performs discrete Fourier transformation with respect to waveform data of the voltage signal and the current signal that are sequentially stored in the waveform data storage unit c1, calculates impedance by dividing a discrete Fourier transformation result of the voltage signal by a discrete Fourier transformation result of the current signal, and stores the calculated impedance data in an impedance data storage unit c3. In addition, depending on a type of the waveform data, high-speed of a calculation process may be realized by using a FFT calculator in place of the DFT calculator c2.

A circuit constant estimator c4 performs constant fitting in an equivalent circuit model, which is designated in advance, based on the impedance data that is stored in the impedance data storage unit c3. In regard to a circuit constant, which is estimated and calculated by the circuit constant estimator c4, for example, in the case of an equivalent circuit shown in FIG. 14, R4 and L4 are stored in a non-variable circuit constant storage unit c5, and R1, R2, C2, R3, and C3 are stored in a circuit constant storage unit c6.

An impedance estimator c7 outputs impedance at an arbitrary frequency. With respect to a frequency domain at which impedance data is present, impedance data that is stored in the impedance data storage unit c3 is output as is. With respect to a frequency domain at which impedance data is not present, impedance is estimated and calculated based on a circuit constant that is stored in the non-variable circuit constant storage unit c5 and the circuit constant storage unit c6, and the calculation result is output.

An analysis condition from the outside is stored in an analysis condition storage unit c8. The analysis condition mainly represents a calculation condition in each calculator, but also includes information about reference measurement or measurement at the time of being mounted in a system.

Figure 4A:
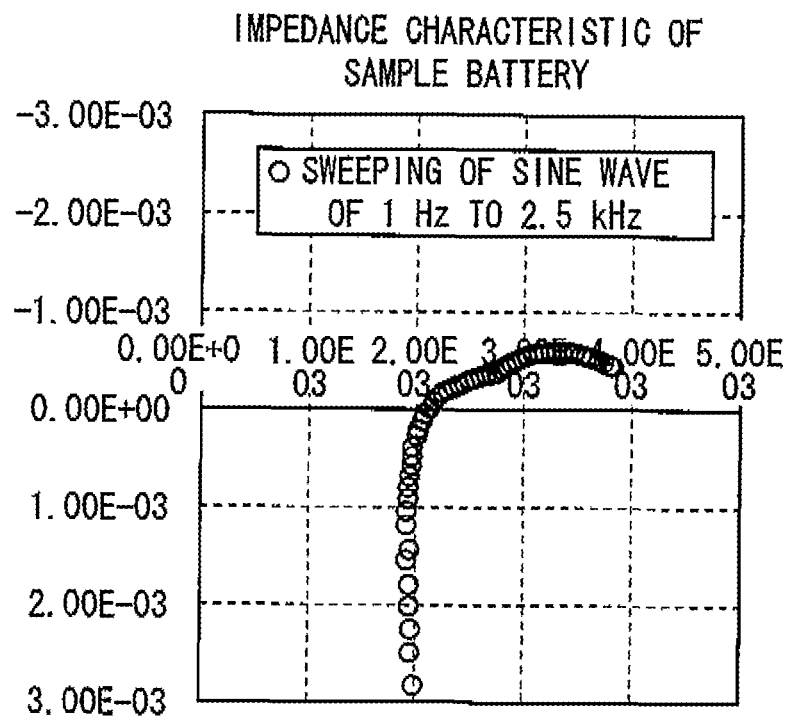
FIGS. 4A to 4D show diagrams of an impedance characteristic example of a battery.

FIGS. 4A to 4D shows a drawing of an impedance characteristic example of the battery, in which FIG. 4A shows a result that is measured while sweeping a sine wave in a frequency range of 1 Hz to 2.5 kHz and securing a sufficient sample rate at each measurement frequency point. Then, FIG. 4A is set as a reference characteristic.

Figure 4B:
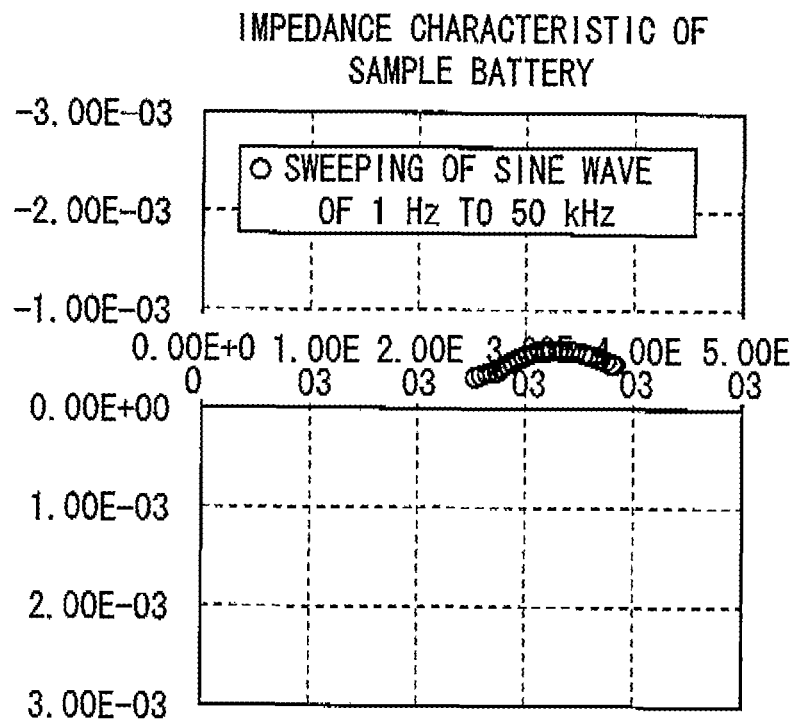

FIG. 4B shows a result that is obtained by taking out a frequency range of 1 to 50 Hz from the reference characteristic of FIG. 4A. This assumes a case in which a high frequency domain may not be measured due to restriction when the battery is mounted, for example, in a vehicle system. A positive side (a lower half portion of a graph) of an imaginary axis that is shown in FIG. 4A is a region including L (inductance) information of the battery, but in FIG. 4B, this portion is completely omitted.

The inductance of the battery is a structural characteristic, and is considered not to vary with the passage of time due to deterioration of an electrode or an electrolytic solution. Based on this consideration, an equivalent circuit constant is obtained in advance from the reference characteristic of FIG. 4A, and this constant may be used with respect to a constant that does not vary with the passage of time even after the battery is mounted in a system.

Figure 4C:
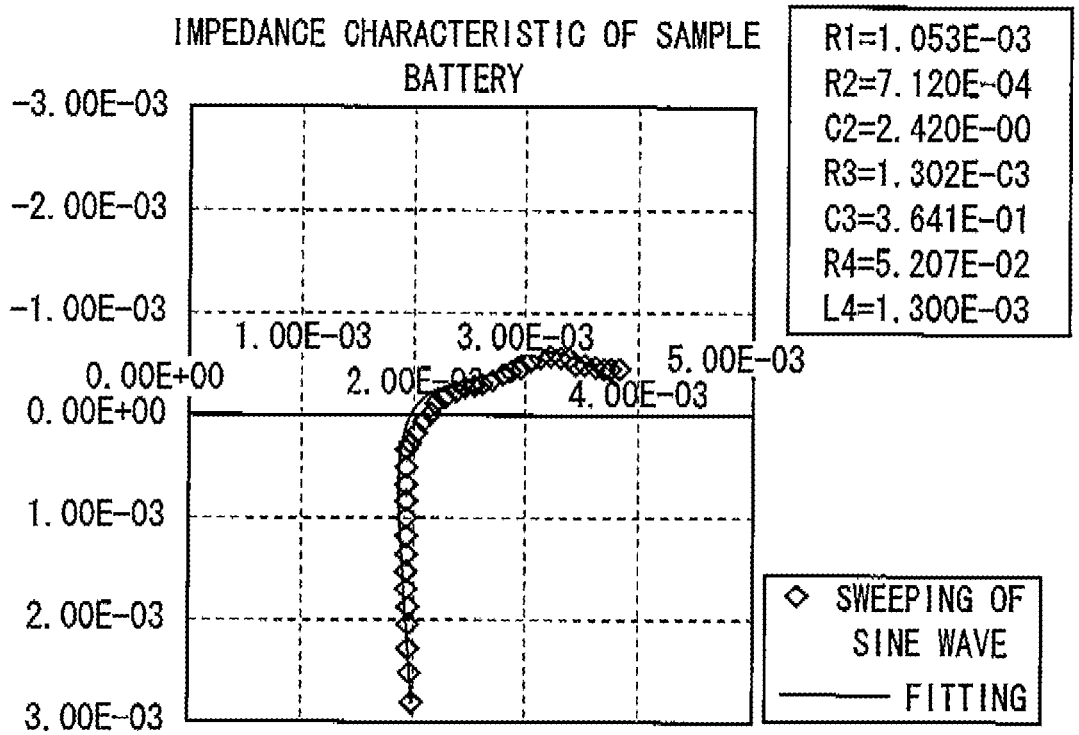
Figure 14:
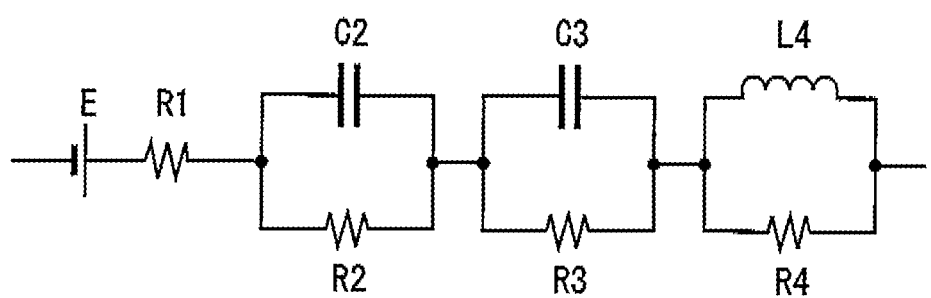
FIG. 14 shows a diagram of an equivalent circuit example of a battery.

FIG. 4C shows an impedance characteristic curve that is derived from R1, R2, R3, C2, C3, L4, and R4, and that is obtained by performing the constant fitting of the reference characteristic of FIG. 4A based on the equivalent circuit model of FIG. 14. The fitting may be performed based on a known arithmetic expression.

Figure 4D:
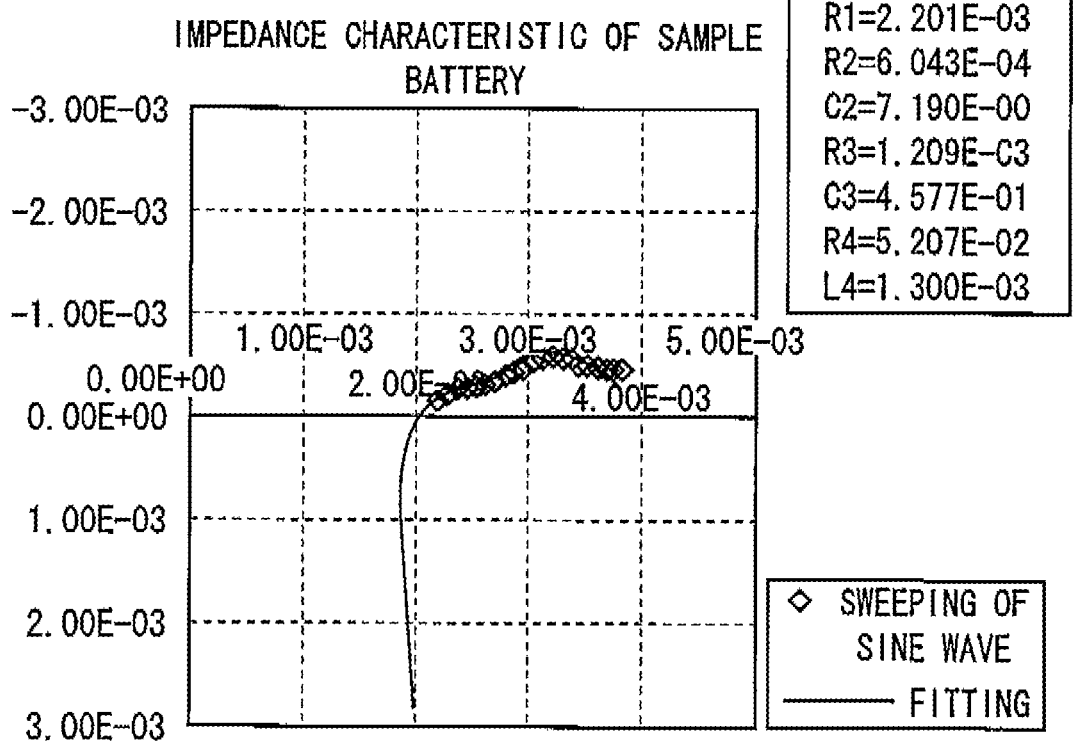

FIG. 4D shows an impedance characteristic curve that is derived from a result obtained by performing the constant fitting based on the equivalent circuit model of FIG. 14 by using circuit constants R1, R2, R3, C2, and C3 that are estimated in FIG. 4B, and L4 and R4 that are acquired in advance. The impedance characteristic curve of FIG. 4D is approximately equal to the impedance characteristic curve of FIG. 4C. That is, the impedance characteristic in a frequency domain corresponding to the reference characteristic of FIG. 4A may be estimated by using the estimated circuit constants R1, R2, R3, C2, and C3 that are estimated in FIG. 4B, and L4 and R4 that are acquired in advance.

In addition, in the embodiment of FIG. 3, the impedance estimation is performed by applying the non-variable circuit constant to the equivalent circuit model. However, instead of applying the non-variable circuit constant to the equivalent circuit, time-series data may be created from the non-variable circuit constant, this may be supplemented to time-series data that is measured, and then another circuit constant may be estimated.

In addition, in the embodiment in FIG. 3, the constant estimation is performed on the assumption that the L component does not have an effect on the low frequency domain. Therefore, the non-variable circuit constants L4 and R4 are not included in the equivalent circuit model during the constant estimation, and the non-variable circuit constants L4 and R4 are used only during the impedance estimation. However, there is a probability in that the L component may have an effect on the low frequency domain in accordance with a battery characteristic. In this case, the constant estimation may be performed after the non-variable circuit constants L4 and R4 are included in the equivalent circuit during the constant estimation.

Figure 5A:
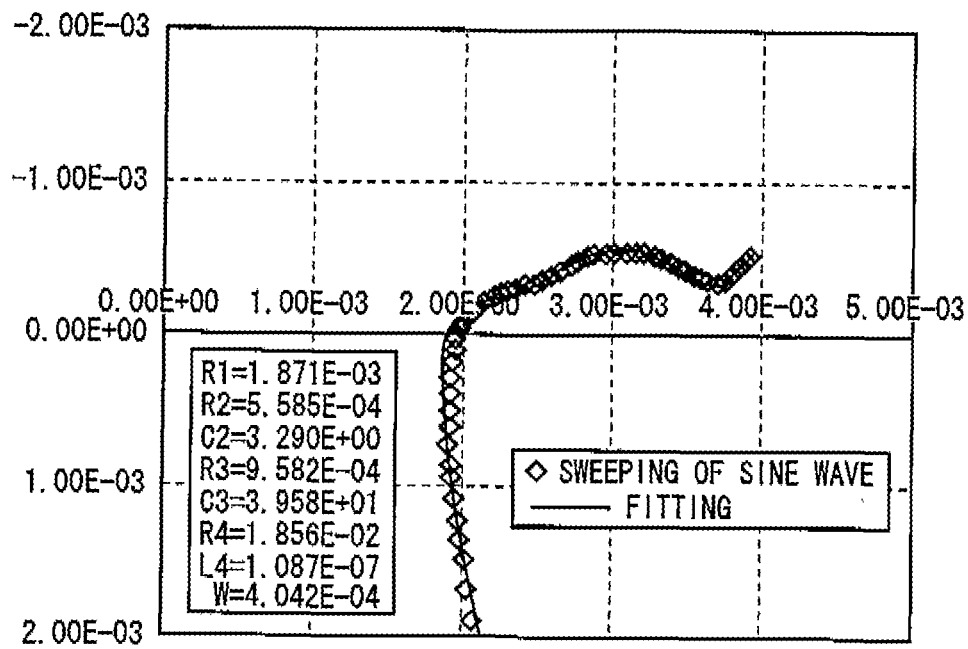
FIGS. 5A and 5B show diagrams of a constant-estimation impedance characteristic example with respect to an equivalent circuit of FIG. 14.
Figure 5B:
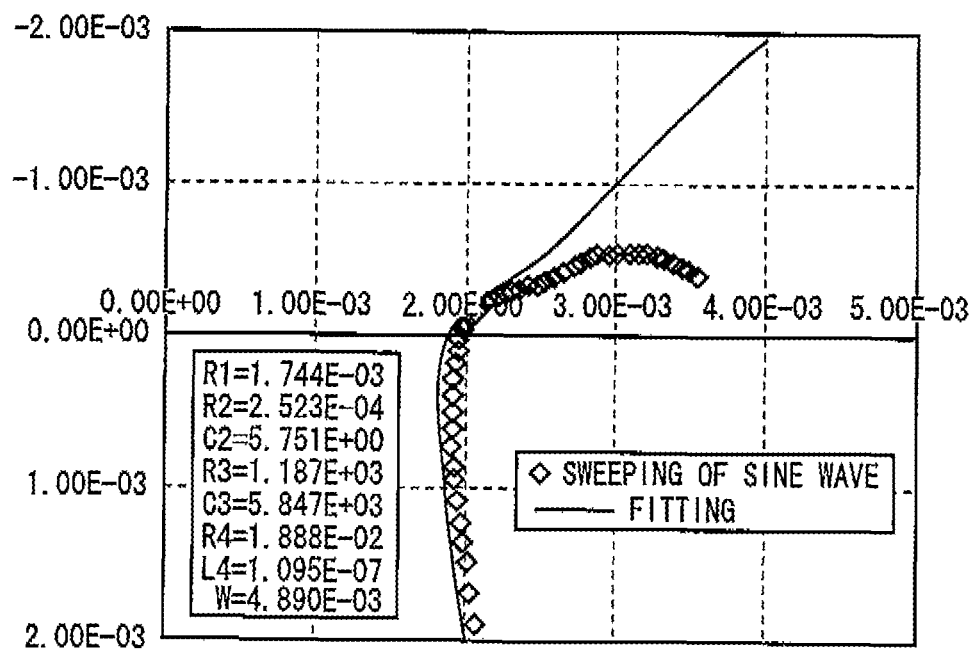

However, at the time of selecting the equivalent circuit model of the battery, in a case where an appropriate equivalent circuit model is selected after a characteristic inherent to a battery that is an object to be measured or a measurement frequency range is not recognized in advance, as shown in diagrams of an impedance characteristic example of FIGS. 5A and 5B, a constant estimation result that is different from an actual value may be obtained.

FIGS. 5A and 5B show results obtained by extracting data of different frequency ranges from the same impedance data, respectively, and by performing constant estimation in the equivalent circuit of FIG. 14. FIG. 5A is a result that is obtained by extracting 0.1 Hz or more, in which an impedance characteristic curve derived by constant fitting and an actual impedance characteristic are consistent with each other.

Conversely, FIG. 5B is a result that is obtained by extracting 1.0 Hz or more, in which an actual impedance characteristic is greatly deviated from an impedance characteristic curve derived by constant fitting. This is assumed to be because even though an actual product is provided with a Warburg element, a characteristic thereof is not significantly reflected on data and thus may be locally deficient. In this way, even in the same equivalent circuit model, when impedance frequency ranges that are used in the constant estimation are different from each other, results that are completely different from each other may be obtained.

Figure 6:
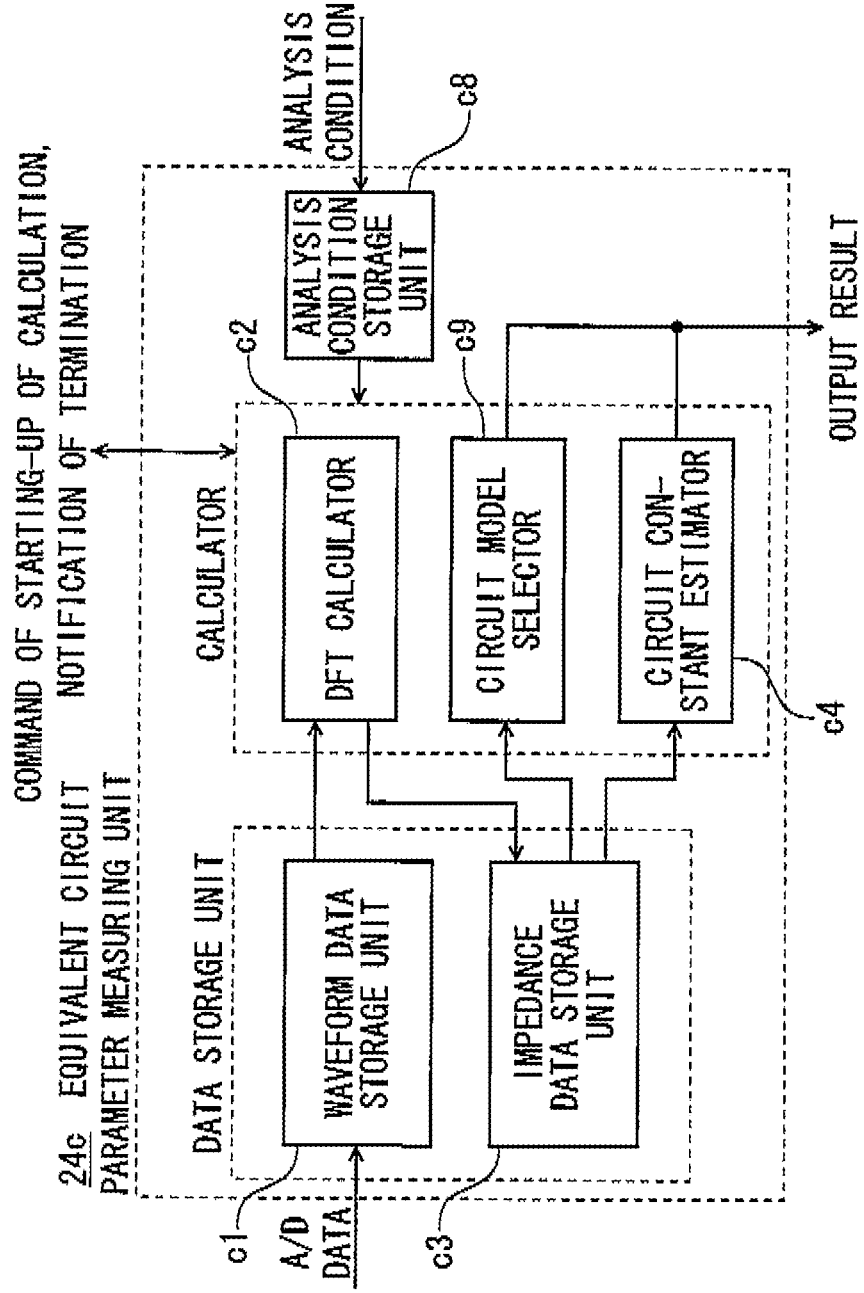
FIG. 6 shows a block diagram illustrating another embodiment of the invention.

This problem may be avoided by selecting an optimal equivalent circuit model based on a characteristic of impedance data by using a unit that is configured as shown in FIG. 6 as the equivalent circuit parameter measuring unit 24c, and accuracy of the circuit constant estimation may be improved.

FIG. 6 shows a block diagram illustrating another embodiment of the invention, which has a function of selecting an optimal equivalent circuit model, and the same reference numerals are attached to the same portions as FIG. 3. In FIG. 6, a circuit model selector c9 selects an optimal equivalent circuit model based on impedance data characteristic that is estimated in the DFT calculator c2 and is stored in the impedance data storage unit c3. The circuit constant estimator c4 performs estimation and calculation of each circuit constant based on impedance data that is stored in the impedance data storage unit c3 and the optimal equivalent circuit model that is selected in the circuit model selector c9.

A battery equivalent circuit model that is generally used includes an RC parallel circuit of n stages, an LR parallel circuit of one stage, and a Warburg element. Therefore, the circuit model selector c9 sequentially determines a specific configuration of the equivalent circuit model in the following order.

1) Whether or not the Warburg element is present
2) Whether or not the LR parallel circuit is present
3) The number of stages of the RC parallel circuit 1) First, in regard to the Warburg element, whether or not the Warburg element is present is determined by using a correlation coefficient of impedance real axis and imaginary axis on a low frequency side. For example, in the case of Corr <0.99, it is determined that Warburg is present. The correlation coefficient is calculated by the following expression.

$$\text{Corr}(i) = \frac{\sum_{j=i-a}^{i+a}(Zreal_j - \overline{Zreal}_{i-a}^{i+a})(Zimg_j - \overline{Zimg}_{i-a}^{i+a})}{\sqrt{\sum_{j=i-a}^{i+a}(Zreal_j - \overline{Zreal}_{i-a}^{i+a})^2}\sqrt{\sum_{j=i-a}^{n}(Zimg_j - \overline{Zimg}_{i-a}^{i+a})^2}} \quad (1)$$

Here, Corr (i) represents a correlation coefficient at the periphery of $i^{th}$ impedance data, $Zreal_j$ and $Zimg_j$ represent a real part and an imaginary part of $j^{th}$ impedance data, respectively.

$$\overline{Zreal}_{i-a}^{i+a} \quad (2)$$

$$\overline{Zimg}_{i-a}^{i+a} \quad (3)$$

The above expressions (2) and (3) represent average values of the real part and the imaginary part of $i-a^{th}$ to $i+a^{th}$ impedance data, respectively. In addition, it is assumed that the impedance data is arranged in ascending order of a frequency.

Figure 7:
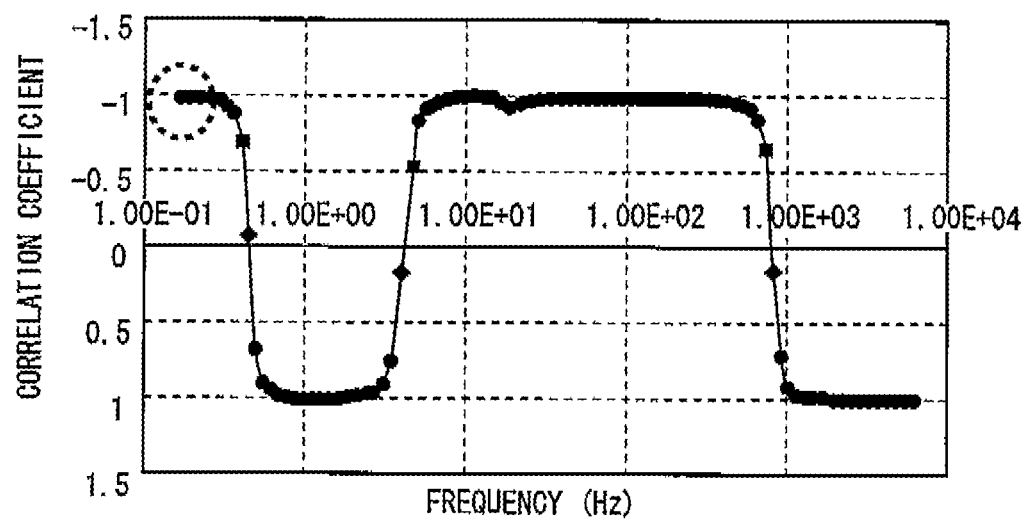
FIG. 7 shows a graph of a correlation coefficient Corr(i) where a is 4.

FIG. 7 shows a graph of the correlation coefficient Corr(i) in which a is four. In this current sample data, it is determined that Warburg is "present".

Figure 8:
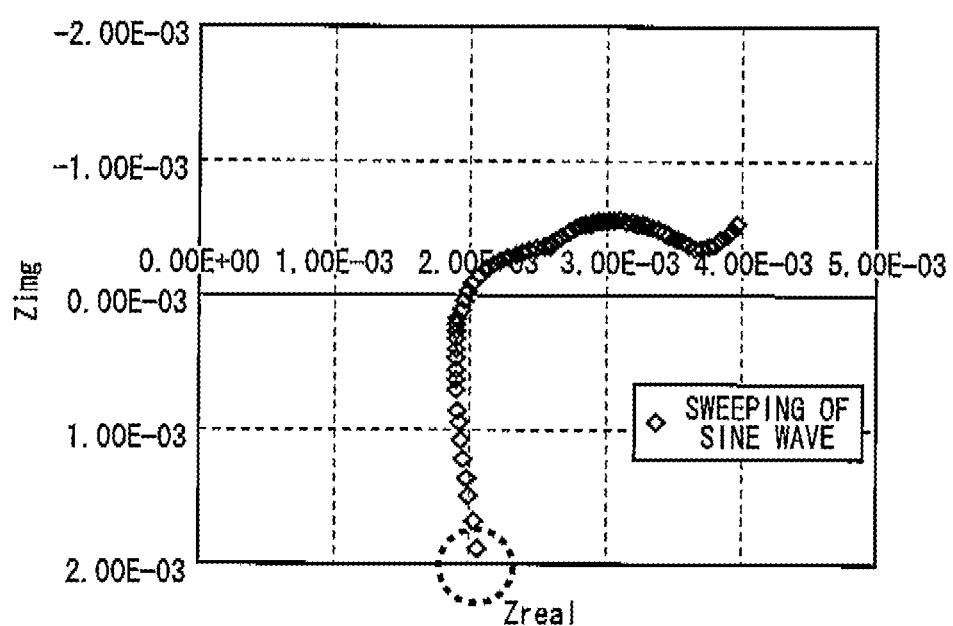
FIG. 8 shows a diagram of a sample impedance characteristic example.

2) Next, whether or not the LR parallel circuit is present is determined. When the impedance imaginary axis on a high frequency side shows a positive value, it is determined that the LR parallel circuit is necessary. In the case of a sample impedance characteristic diagram of FIG. 8, it is determined that the LR parallel circuit is "present".

Figure 9A:
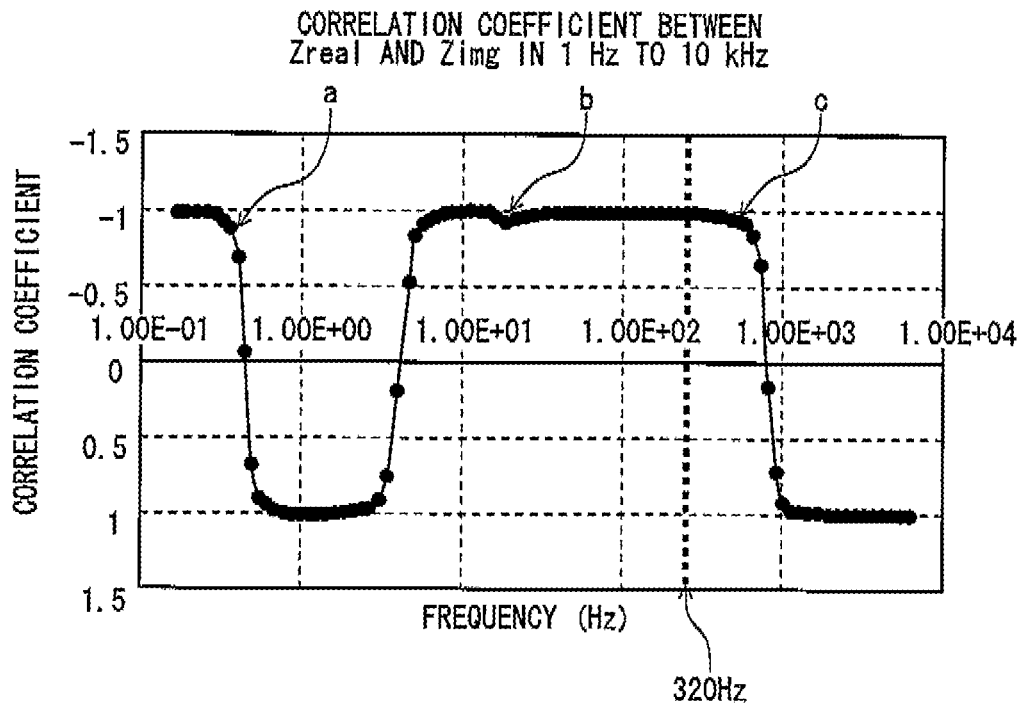
FIG. 9A shows a graph of another correction coefficient and FIG. 9B shows a diagram of another sample impedance characteristic example.
Figure 9B:
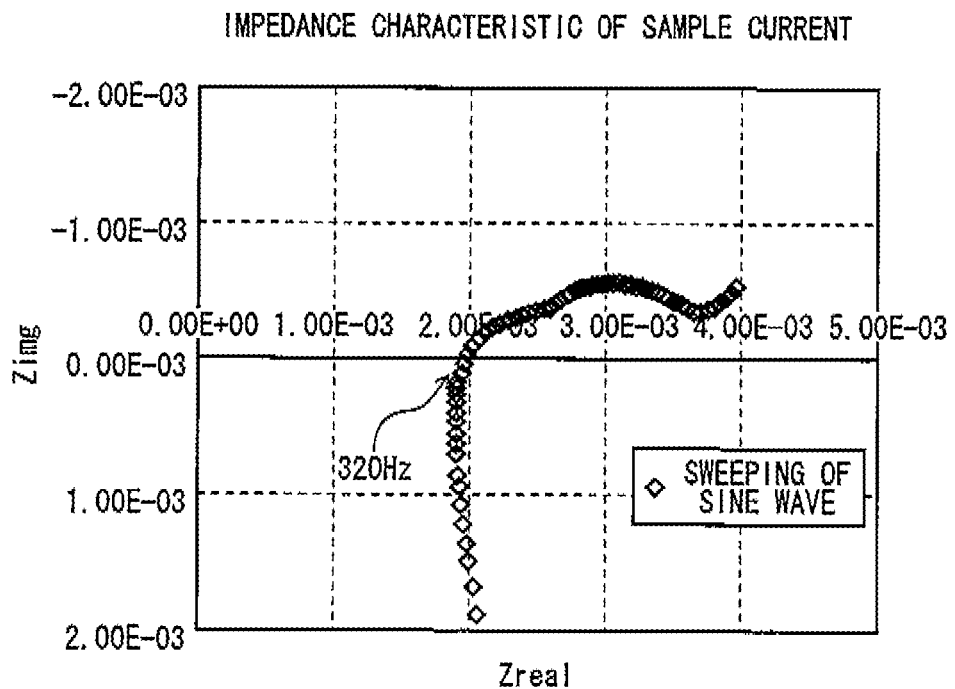

3) Finally, the number of stages of the RC parallel circuit is determined. This determination is performed with the number of times when the correlation coefficient exceeds Corr(i) of −0.95 in a direction from the negative to the positive in whole data. However, a case in which the imaginary axis of the impedance exceeds the Corr(i) of 0.95 in a positive domain is regarded as a LR characteristic and thus the case is not counted. In sample data shown in FIG. 9A, the correlation coefficient exceed −0.95 at three points of a, b, and c, but as shown in FIG. 9B, since the c point exceeds −0.95 at a positive domain in which the impedance imaginary axis exceeds 320 Hz, this case is not counted, and the RC parallel circuit is determined as two stages.

Due to this determination, estimation accuracy of each circuit constant that is estimated and calculated in the circuit constant estimator c4 is improved.

When voltage and current data may be acquired under a sufficient measurement environment, the impedance characteristic may be extracted. However, for example, in a state in which the battery is mounted in the vehicle, due to an effect such as noise, it is difficult to say that a preferable measurement result is always obtained.

In this case, the constant estimation and calculation may be performed in parallel after selecting a plurality of equivalent circuit model candidates, and an equivalent circuit model in which an error with object impedance data is the minimum may be determined as an ultimate output.

In addition, there may be provided a function of calculating an error with object impedance data at any time during repetitive calculation, of stopping the calculation with respect to a model that does not satisfy a reference value or a model that does not clearly converge, and of selecting another model.

In addition, the power and impedance calculator 24 that is used in the invention may be packaged in an ultra-compact size by using a semiconductor integrated circuit technology, and even in the case of being mounted in each battery cell of a battery module that is mounted, for example, in a vehicle, the power and impedance calculator 24 may be used as long as a minuscule space is secured.

In addition, in the respective embodiments, a description was made with respect to an example in which the internal impedance of each of the battery cells of the battery module that is mounted in the vehicle is measured, but the battery impedance measuring device of the invention is also effective for the monitoring of a storage battery that is provided in a power plant, a household power storage system, and the like other than the vehicle.

As described above, according to the battery impedance measuring device of the invention, a battery monitoring device, which measures an internal impedance characteristic of a battery in real time on the spot, such as a vehicle, a power plant, a household power storage system, and the like that actually use the battery and which monitors a battery state in real time, may be realized.

Hereinafter, the battery impedance measuring device according to the present embodiment will be described in relation to hardware components.

Figure 15:
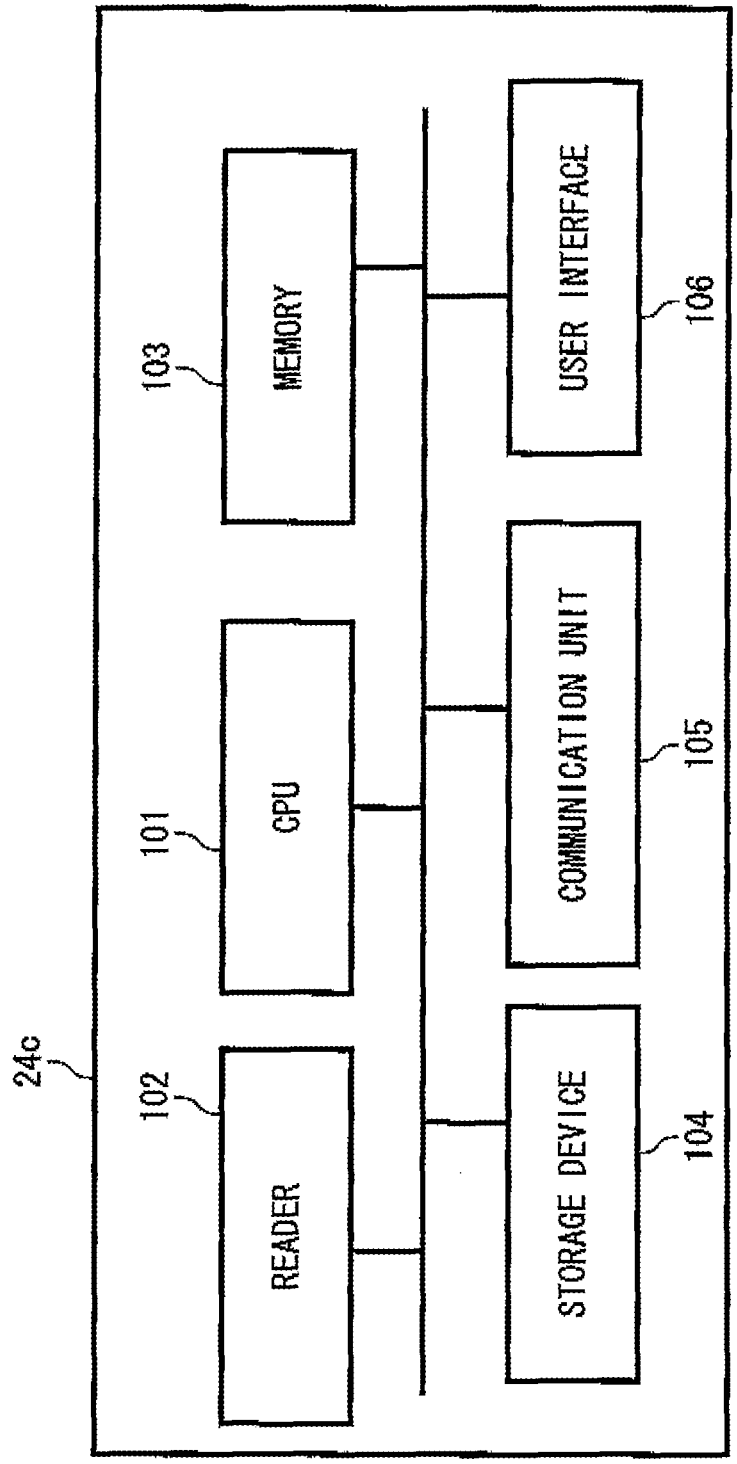
FIG. 15 is a schematic diagram showing a hardware configuration of an equivalent circuit parameter measuring unit (24c) according to the present embodiment.

FIG. 15 is a schematic diagram showing a hardware configuration of the equivalent circuit parameter measuring unit (24c) according to the present embodiment. As shown in FIG. 15, the equivalent circuit parameter measuring unit (24c) includes a CPU (101), a reader (102), a memory (103), a storage device (104), a communication unit (105) and a user interface (106). The CPU (101) (for example, a processor) may serve as the DFT calculator (c2), the circuit constant estimator (c4) and the impedance estimator (c7) shown in FIG. 3. Also, the CPU (101) may serve as the DFT calculator (c2), the circuit model selector (c9) and the circuit constant estimator (c4) shown in FIG. 6.

The memory (103) may be any type of memory such as ROM, RAM or a flash memory. The memory (103) may serve as a working memory of the CPU (101) when the CPU (101) executes a program. The storage device (104) is configured to store programs to be executed by the CPU (101) and/or data generated by the respective units. The storage device (104) may be any type of storage device such as a hard disk drive (HDD) or solid state drive (SSD). A program which includes instructions for causing the CPU (101) to execute respective operations performed by the equivalent circuit parameter measuring unit (24c) may be stored in the storage device (104) or in a computer-readable medium such as a Btu-ray Disc (trademark), DVD, a CD, a floppy disc, a flash memory, or magneto-optical (MO) disc. The reader (102) is configured to read the program stored in the above-computer readable medium into the memory (103). The program may be also downloaded from another device (for example, a server) on a network (for example, the Internet) through the communication unit (105). With this configuration shown in FIG. 15, the CPU (101) is configured to implement the respective operations performed by the equivalent circuit parameter measuring unit (24c) according to the program read from the reader (102) or downloaded through the communication unit (105).

While the present invention has been shown and described with reference to certain exemplary embodiments thereof; other implementations are within the scope of the claims. It will be understood by those skilled in the art that various changes in form and details may be made therein without departing from the spirit and scope of the invention as defined by the appended claims.

What is claimed is:

1. A device for calculating impedances of a battery cell for respective frequency domains, the device comprising:
 a Fourier transformation calculator configured to perform Fourier transformation on voltage waveform data and current waveform data, which are output from the battery cell, and calculate an impedance of the battery cell by dividing a Fourier transformation data of the voltage waveform data by a Fourier transformation data of the current waveform data;
 a circuit constant estimator configured to estimate circuit constants of a predetermined equivalent circuit model of the battery cell, based on the impedance calculated by the Fourier transformation calculator;
 an impedance estimator configured to estimate impedances of the battery cell for respective frequency domains, based on the estimated circuit constants and the equivalent circuit model;
 a non-variable circuit constant storage unit configured to store a non-variable circuit constant of the estimated circuit constants therein; and
 a variable circuit constant storage unit configured to store a variable circuit constant of the estimated circuit constants therein.

2. A device for calculating impedances of a battery cell for respective frequency domains, the device comprising:
 a Fourier transformation calculator configured to perform Fourier transformation on voltage waveform data and current waveform data, which are output from the battery cell, and calculate an impedance of the battery cell by dividing a Fourier transformation data of the voltage waveform data by a Fourier transformation data of the current waveform data;
 a circuit model selector configured to select a certain equivalent circuit model from among a plurality of equivalent circuit model, based on the impedance calculated by the Fourier transformation calculator;
 a circuit constant estimator configured to estimate circuit constant of the selected equivalent circuit model, based on the impedance calculated by the Fourier transformation calculator;
 a non-variable circuit constant storage unit configured to store a non-variable circuit constant of the estimated circuit constants therein; and
 a variable circuit constant storage unit configured to store a variable circuit constant of the estimated circuit constants therein.

3. The device of claim 1,
 wherein the impedance estimator is configured to estimate the impedances of the battery cell based on the non-variable circuit constant, the variable circuit constant and the equivalent circuit model.

4. The device of claim 2, wherein the circuit model selector is configured to select the certain equivalent circuit model based on the following steps: 1) whether or not a Warburg element is present; 2) whether or not an LR parallel circuit is present; and 3) the number of stages of an RC parallel circuit.

5. The device of claim 1 or 2, wherein the Fourier transformation calculator is a discrete Fourier transformation calculator configured to discreet Fourier transformation on the voltage waveform data and the current waveform data, and calculate an impedance of the battery cell by dividing a discrete Fourier transformation data of the voltage waveform data by a discrete Fourier transformation data of the current waveform data.

6. The device of claim 1 or 2, wherein the Fourier transformation calculator is a fast Fourier transformation calculator configured to fast Fourier transformation on the voltage waveform data and the current waveform data, and calculate an impedance of the battery cell by dividing a fast Fourier transformation data of the voltage waveform data by a fast Fourier transformation data of the current waveform data.

7. A battery impedance measuring system, comprising:
a battery module comprising a plurality of battery cells and configured to provide power to a load;
a plurality of devices each provided for a corresponding one of the battery cells to calculate impedances of the corresponding battery cell for respective frequency domains, each of the devices comprising:
a Fourier transformation calculator configured to perform Fourier transformation on voltage waveform data and current waveform data, which are output from the corresponding battery cell, and calculate an impedance of the corresponding battery cell by dividing a Fourier transformation data of the voltage waveform data by a Fourier transformation data of the current waveform data;
a circuit constant estimator configured to estimate circuit constants of a predetermined equivalent circuit model of the corresponding battery cell, based on the impedance calculated by the Fourier transformation calculator;
an impedance estimator configured to estimate impedances of the corresponding battery cell for respective frequency domains, based on the estimated circuit constants and the equivalent circuit model;
a non-variable circuit constant storage unit configured to store a non-variable circuit constant of the estimated circuit constants therein; and
a variable circuit constant storage unit configured to store a variable circuit constant of the estimated circuit constants therein.

8. A battery impedance measuring system, comprising:
a battery module comprising a plurality of battery cells and configured to provide power to a load;
a plurality of devices each provided for a corresponding one of the battery cells to calculate impedances of the corresponding battery cell for respective frequency domains, each of the devices comprising:
a Fourier transformation calculator configured to perform Fourier transformation on voltage waveform data and current waveform data, which are output from the corresponding battery cell, and calculate an impedance of the corresponding battery cell by dividing a Fourier transformation data of the voltage waveform data by a Fourier transformation data of the current waveform data;
a circuit model selector configured to select a certain equivalent circuit model from among a plurality of equivalent circuit model, based on the impedance calculated by the Fourier transformation calculator;
a circuit constant estimator configured to estimate circuit constant of the selected equivalent circuit model, based on the impedance calculated by the Fourier transformation calculator;
a non-variable circuit constant storage unit configured to store a non-variable circuit constant of the estimated circuit constants therein; and
a variable circuit constant storage unit configured to store a variable circuit constant of the estimated circuit constants therein.

9. A battery monitoring device for real-time measurement, which monitors a battery module comprising a plurality of battery cells connected to each other in series, the device comprising:
a plurality of power and impedance calculators each provided for a corresponding one of the battery cells, and each configured to receive a voltage signal and a current signal from the corresponding battery cell and to measure an instantaneous power value and an internal impedance characteristic of the corresponding battery cell;
a battery module state manager configured to receive output data of the respective power and impedance calculators via an internal bus;
a circuit constant estimator configured to estimate circuit constants of a predetermined equivalent circuit model of the corresponding battery cell, based on the impedance calculated by the plurality of power and impedance calculators;
a non-variable circuit constant storage unit configured to store a non-variable circuit constant of the estimated circuit constants therein; and
a variable circuit constant storage unit configured to store a variable circuit constant of the estimated circuit constants therein.

10. The battery monitoring device according to claim 9, further comprising:
an accelerator work monitor configured to monitor a movement of an accelerator which operates by receiving a power from the battery module, and to supply a resulting detection signal to the respective power and impedance calculators and the battery module state manager.

11. The battery monitoring device according to claim 9 or 10, wherein each of the power and impedance calculators is configured to perform discrete Fourier transformation or fast Fourier transformation, and to estimate constants of an equivalent circuit that exhibits an internal impedance characteristic of the corresponding battery cell in a desired frequency domain, based on results of the discrete Fourier transformation or fast Fourier transformation.

* * * * *